(12) United States Patent
Lee et al.

(10) Patent No.: US 7,777,225 B2
(45) Date of Patent: Aug. 17, 2010

(54) ORGANIC LIGHT-EMITTING DISPLAY DEVICE

(75) Inventors: Hun-jung Lee, Suwon (KR); Nam-choul Yang, Suwon (KR); Jae-kyeong Jeong, Suwon (KR); Hyun-soo Shin, Suwon (KR); Jin-seong Park, Suwon (KR); Jong-han Jeong, Suwon (KR); Yeon-gon Mo, Suwon (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 126 days.

(21) Appl. No.: 12/120,693

(22) Filed: May 15, 2008

(65) Prior Publication Data

US 2008/0290343 A1 Nov. 27, 2008

(30) Foreign Application Priority Data

May 21, 2007 (KR) ...................... 10-2007-0049147

(51) Int. Cl.
*H01L 31/00* (2006.01)
(52) U.S. Cl. ..................... 257/59; 257/72; 257/258; 257/E31.001
(58) Field of Classification Search ................... 257/59, 257/72, 258, E31.001
See application file for complete search history.

(56) References Cited

FOREIGN PATENT DOCUMENTS

| JP | 2004-273614 | 9/2004 |
|---|---|---|
| KR | 2003-0031650 | 4/2003 |
| KR | 10-0635514 | 10/2006 |
| KR | 10-2007-0025253 | 3/2007 |
| KR | 10-2007-0102063 | 10/2007 |

OTHER PUBLICATIONS

Patent Abstracts of Japan, Publication No. 2004-273614; Date of Publication: Sep. 30, 2004; in the name of Tatsuya Fujita, et al.
Korean Patent Abstracts, Publication No. 100635514 B1; Date of Publicatioin: Oct. 11, 2006; in the name of Dong Soo Choi, et al.
Uchida, Takayuki et al., "Transparent Organic Light-Emitting Devices Fabricated by Cs-Incorporated RF Magnetron Sputtering Deposition," Japanese Journal of Applied Physics, vol. 44, No. 8, 2005, pp. 5939-5942.

*Primary Examiner*—Tan N Tran
(74) *Attorney, Agent, or Firm*—Christie, Parker & Hale, LLP

(57) ABSTRACT

An organic light-emitting display device. The organic light-emitting display device according to an embodiment of the present invention utilizes an N-type driving transistor, and therefore it has a drain electrode of a driving transistor electrically connected to a cathode electrode of an organic light-emitting diode, wherein the organic light-emitting display device includes a thin metal film between the cathode electrode and the organic light-emitting layer.

18 Claims, 2 Drawing Sheets

ORGANIC LIGHT-EMITTING DISPLAY DEVICE

CROSS-REFERENCE TO RELATED APPLICATIONS

This application claims priority to and the benefit of Korean Patent Application No. 10-2007-0049147, filed on May 21, 2007, in the Korean Intellectual Property Office, the entire content of which is incorporated herein by reference.

BACKGROUND OF THE INVENTION

1. Field of the Invention

The present invention relates to a thin film transistor, and, more particularly, to a thin film transistor including an N-type compound semiconductor as a semiconductor layer of the thin film transistor.

2. Description of Related Art

A thin film transistor used for a conventional organic light-emitting display device can be a thin film transistor that includes amorphous silicon or polysilicon as a semiconductor layer of the thin film transistor.

However, if the semiconductor layer is formed of amorphous silicon, it is difficult to use the semiconductor layer as a drive circuit of a display panel which requires a high operating speed due to the low mobility of the amorphous silicon. By contrast, polysilicon has a high mobility, but an additional compensation circuit should be provided because its threshold voltage is not uniform.

Also, the thin film transistor including material such as amorphous or polysilicon as the semiconductor layer has a problem in that its transistor characteristics are deteriorated due to leakage of electric current generated by the light irradiation.

Accordingly, in order to solve the above problems, there have been attempts to develop a compound semiconductor. For example, FIG. 1 illustrates a thin film transistor using a compound semiconductor that includes ZnO or ZnO as a semiconductor layer of the thin film transistor.

Referring to FIG. 1, the thin film transistor includes a source electrode 20a and a drain electrode 20b formed on an insulating substrate S; a ZnO layer 4 arranged to be in contact with the source and drain electrode 20a, 20b; and a gate insulator 5 and a gate electrode 6 laminated onto the ZnO layer 4.

Here, in FIG. 1, ZnO or a compound semiconductor including the ZnO has a band gap of 3.4, and therefore it is expected that the thin film transistor has an effect that the leakage of an electric current is not increased by the visible light absorption because the ZnO or the compound semiconductor does not absorb the visible light due to the fact that its band gap is higher than a light energy of a visible region.

However, it is common that the ZnO or the compound semiconductor including the ZnO has N-type conductivity due to the oxygen shortage, whereas the organic light-emitting display device uses a P-type driving element.

For example, FIG. 2 illustrates an organic light-emitting display device using a P-type driving element. Referring to FIG. 2, the organic light-emitting display device includes a P-type driving thin film transistor including a gate electrode 40, a source electrode 50a, a drain electrode 50b and a P-type semiconductor layer 60, which are all formed on a substrate 30.

In this case, the source electrode 50a of the driving thin film transistor is connected to a common power pressure line (ELVDD) 96, the drain electrode 50b is connected to an anode electrode 80 of the organic light-emitting diode (OLED), and an organic light-emitting layer 90 is formed on the anode electrode 80, and a cathode electrode 92 formed on the organic light-emitting layer 90 is connected to a second power pressure line 97 to drive an organic light-emitting display device. In addition, an insulator 93, a pixel definition layer 94, a sealing material 98 and an encapsulation substrate 99 are also shown in FIG. 2.

Accordingly, in order to use a driving thin film transistor using an N-type compound semiconductor as a semiconductor layer in the organic light-emitting display device, an anode electrode and a cathode electrode of the organic light-emitting diode have an inverted structure, and therefore there is a need to improve the structure of the organic light-emitting display device.

SUMMARY OF THE INVENTION

An aspect of an embodiment of the present invention is directed toward an organic light-emitting display device that is driven by an N-type driving element, the organic light-emitting display device including an N-type compound semiconductor as a semiconductor layer.

An embodiment of the present invention provides an organic light-emitting display device. The organic light-emitting display device includes: a substrate; a driving thin film transistor array on the substrate and comprising a semiconductor layer composed of an N-type semiconductor compound, a source electrode connected to a first region of the semiconductor layer, and a drain connected to a second region of the semiconductor layer; at least one insulator on the thin film transistor array; a cathode electrode connected to the drain electrode of the driving thin film transistor array; a thin metal film on the cathode electrode and composed of a material having a lower work function than the cathode electrode; an organic light-emitting layer on the thin metal film, the thin metal film being between the organic light-emitting layer and the cathode electrode; and an anode electrode on the organic light-emitting layer.

As such, according to an embodiment of the present invention, the organic light-emitting display device including an N-type driving transistor can be driven by a thin metal film between the cathode electrode and the organic light-emitting layer such that the cathode electrode of the organic light-emitting diode (rather than the anode electrode of the organic light-emitting diode) can be connected to the drain electrode of the N-type driving transistor.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
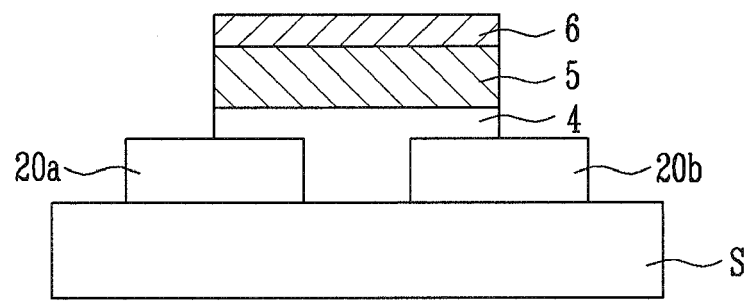
FIG. 1 is a cross-sectional schematic showing a thin film transistor including conventional ZnO as a semiconductor layer of the thin film transistor.
Figure 2:
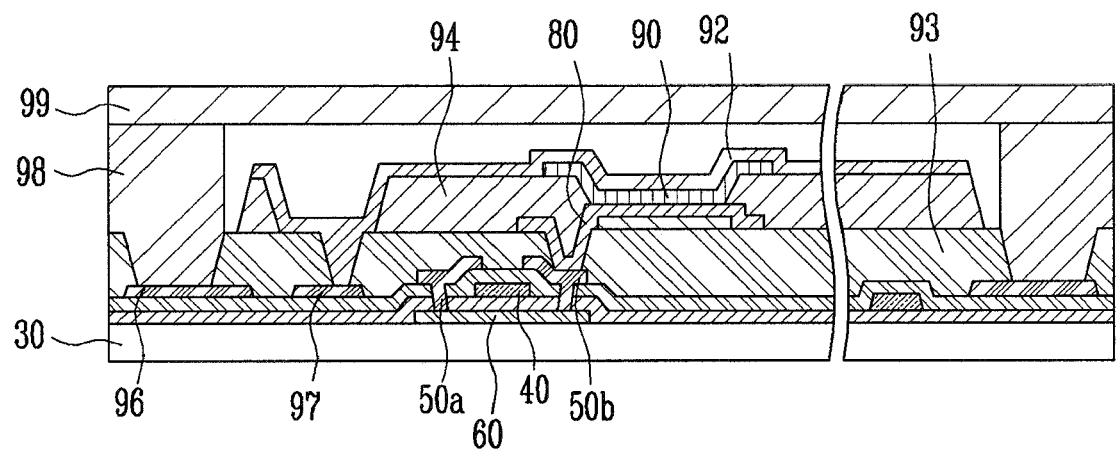
FIG. 2 is cross-sectional schematic showing sections of a conventional driving thin film transistor and a pixel region in an organic light-emitting display device.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Figure 3:
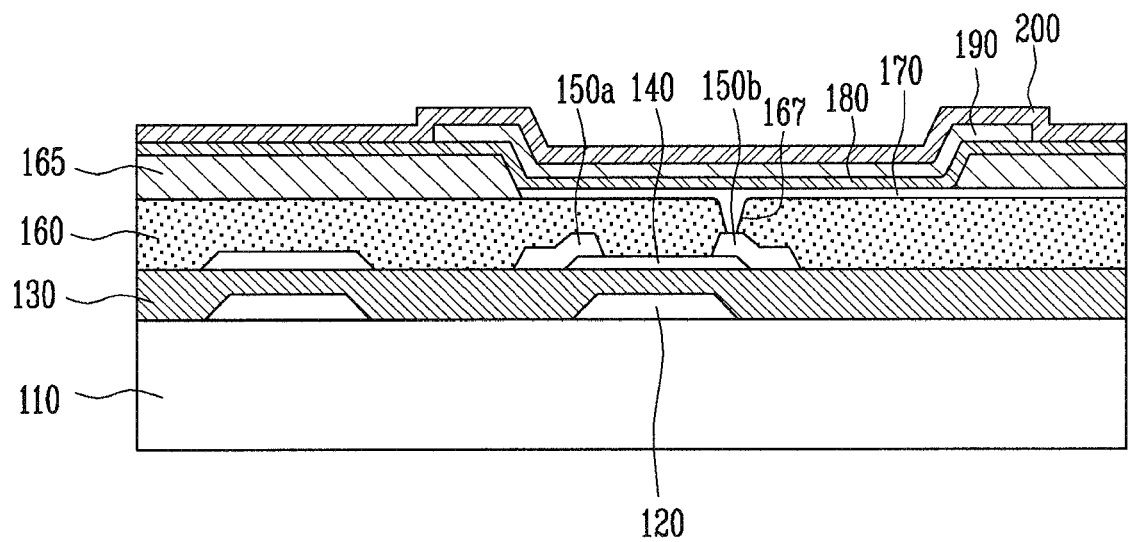
FIG. 3 is cross-sectional schematic showing sections of a driving thin film transistor and a pixel region in an organic light-emitting display device according to an embodiment of the present invention.

FIG. 3 illustrates an organic light-emitting display device including a driving thin film transistor having an inverted staggered structure.

Here, the driving thin film transistor having the inverted staggered structure has a configuration that a gate electrode 120 is provided in a region on a substrate 110, a gate insulator 130 is formed on the gate electrode 120 and the substrate 110, and a semiconductor layer 140 is provided in a region corresponding to the gate electrode 120 and formed on a region of the gate insulator 130, and source and drain electrodes 150a, 150b are contacted to different regions of the semiconductor layer 140, respectively.

In addition, the semiconductor layer 140 is composed of an N-type compound semiconductor. In one embodiment, a compound selected from the group consisting of ZnO, ZnGaO, ZnInO, In2O3, ZnInGaO, ZnSnO, ZnSnO, and combinations thereof is utilized as the N-type compound semiconductor. The listed compounds show N-type electrical characteristics due to the oxygen shortage.

Also, an insulator 160 is formed on the driving thin film transistor array, and the insulator 160 protects the driving thin film transistor by separating it from an organic light-emitting diode which will be formed on the insulator 160. Here, the insulator 160 is shown in FIG. 3 to be composed of a single layer, but the present invention is not thereby limited. For example, the insulator 160 may be provided with both of an organic insulator layer and an inorganic insulator layer, which are referred to as an overcoat and a passivation layer. As used herein, the term thin film transistor array refers to all layers for forming a thin film transistor, and, in the embodiment of FIG. 3, refers to the gate electrode 120, the gate insulator 130, the semiconductor layer 140, and the source and drain electrodes 150a, 150b.

A pixel definition layer 165 is formed on the insulator 160 to partition unit pixels in which the organic light-emitting diodes are arranged, and an organic light-emitting diode is formed inside the unit pixel region.

The organic light-emitting diode is composed of a cathode electrode 170 patterned according to the pixel region; a thin metal film 180 formed in front of (or on) the cathode electrode 170 and the pixel definition layer 165; an organic light-emitting layer 190 formed on a side of the thin metal film 180 facing oppositely away from the cathode electrode 170; and an anode electrode 200 formed on the organic light-emitting layer 190.

Here, as shown in FIG. 3, the cathode electrode 170 is in contact with the drain electrode 150b of the thin film transistor through a via hole 167. This is why the thin film transistor shows N-type electrical characteristics. Also, the cathode electrode 170 is patterned according to the shape of the pixel region defining the pixel definition layer, by utilizing a photolithographic process, etc. The cathode electrode 170 is composed of a compound selected from the group consisting of indium tin oxide (ITO), Ag, Al, and combinations thereof, and the substrate is formed of a suitable transparent material. Accordingly, if a transparent electrode is required for the dual light emission, then, in one embodiment, ITO is utilized because it is a transparent material.

However, the cathode electrode 170 of ITO involves a surface treatment because ITO has low work function. Here, in one embodiment, the use of Cs (or cesium) functions to lower work function.

A reflective layer may be formed below and/or as part of the cathode electrode 170 for front emission. The reflective layer may be formed of a material selected from the group consisting of Au, Ag, Ni, and combinations thereof.

The thin metal film 180 is formed in (or on) a front surface of the cathode electrode 170 and the pixel definition layer 165. A material of the thin metal film 180 is formed of a material having a lower work function than a material of the cathode electrode 170. For example, a non-limiting example of the material of the thin metal film 180 may be a material selected from the group consisting of Cs, Mg, Li, and combinations thereof. These materials serve to reduce the work function of the cathode electrode.

Here, the thin metal film 180 is not formed in a pattern type on the front surface because it is difficult to pattern the materials due to their high reactivity characteristics. If the thin metal film 180 is formed on the front surface without forming a pattern, then a short may be created between adjacent thin film transistors due to the conductivity of the thin metal film, but if the thin metal film 180 is formed at a thickness of less than 10 Å, for example, 0.01 Å, 0.1 Å, 1 Å, or 10 Å, then the conductivity of the thin metal film may be lowered, thereby reducing (or preventing) the short.

In addition, an electron injection layer or an electron transporting layer or both layers may be formed between the cathode electrode 170 and the organic light-emitting layer 190, depending on the materials of the cathode electrode 170 and the organic light-emitting layer 190, the electron injection layer or the electron transporting layer aiding to transport electrons.

Also, a hole injection layer or a hole transporting layer, or both layers may be formed between the organic light-emitting layer 190 and the anode electrode 200, depending on the materials of the organic light-emitting layer and the anode electrode, the hole injection layer or the hole transporting layer aiding to inject and transport holes.

Figure 4:
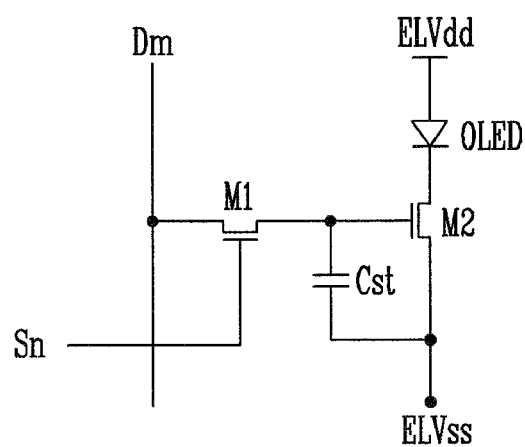
FIG. 4 is a circuit view showing one embodiment of a pixel circuit of the organic light-emitting display device of FIG. 3 that includes an N-type driving thin film transistor.

Further, an embodiment of the pixel circuit of the organic light-emitting display device including an N-type driving thin film transistor will be described in more detail with reference to FIG. 4. The pixel circuit of the organic light-emitting display device according to the embodiment of the present invention includes a switching thin film transistor (M1), a driving thin film transistor (M2), a capacitor (Cst) and an organic light-emitting diode (OLED).

Here, the switching thin film transistor (M1) and the driving thin film transistor (M2) are composed of N-type driving thin film transistors, but the present invention is limited thereto. If the driving thin film transistor is composed of N-type driving thin film transistors as described in the previous embodiment, the switching thin film transistor (M1) is also composed of N-type driving thin film transistors for simplicity in the manufacturing process.

The switching thin film transistor (M1) has a gate electrode connected to a scan line (Sn), and therefore transmits a data voltage, supplied from a data line (Dm) connected to the drain electrode, to the gate electrode of the driving thin film transistor (M2) in response to a selection signal supplied from the scan lines.

The driving thin film transistor (M2) has a source electrode connected to a reference voltage (ELVss), a gate electrode connected to a source electrode of the switching thin film transistor (M1), and a drain electrode connected to a cathode electrode of an organic light-emitting diode (OLED).

The capacitor (Cst) is connected between the gate electrode and the source electrode of the driving thin film transistor (M2) so as to sustain a gate-source voltage ($V_{GS}$) for a given period.

The organic light-emitting diode (OLED) has an anode electrode commonly connected to the power source voltage (ELVdd), and the cathode electrode of the organic light-emitting diode (OLED) is connected to the drain electrode of the driving thin film transistor (M2).

Referring to an operation of the above-mentioned pixel circuit according to one embodiment of the present invention, if the switching thin film transistor (M1) is turned on by the selection signal which is applied to the gate electrode of the switching thin film transistor (M1) through the scan line (Sn) as described above, then the data signal transmitted through the data line (Dm) is transmitted to the capacitor (Cst) and stored in the capacitor (Cst). Then, the data signal stored in the capacitor (Cst) is transmitted to the driving thin film transistor (M2). Therefore, the driving thin film transistor (M2) supplies a driving electric current to the organic light-emitting diode (OLED) through the cathode electrode to correspond to the applied data signal, thereby emitting light.

The present invention, however, is not limited by the above described embodiments. For example, the driving thin film transistor having an inverted staggered structure was described in the above-mentioned embodiment, but the present invention is particularly limited thereto, and it should be understood that the driving thin film transistor having a top gate structure, a bottom gate structure and a coplanar structure may also be formed of N-type compound semiconductors in substantially the same manner as described above. Also, it is considered that the pixel circuit of the organic light-emitting display device according to an embodiment of the present invention may further include a compensation circuit for compensating for a separate threshold voltage, etc.

As such, while the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light-emitting display device, comprising:
   a substrate;
   a driving thin film transistor array on the substrate and comprising a semiconductor layer composed of an N-type semiconductor compound, a source electrode connected to a first region of the semiconductor layer, and a drain electrode connected to a second region of the semiconductor layer;
   at least one insulator on the thin film transistor array;
   a cathode electrode directly connected to the drain electrode of the driving thin film transistor array;
   a thin metal film on the cathode electrode and composed of a material having a lower work function than the cathode electrode;
   an organic light-emitting layer on the thin metal film, the thin metal film being between the organic light-emitting layer and the cathode electrode; and
   a anode electrode on the organic light-emitting layer,
   wherein the thin metal film has a thickness ranging from about 0.01 to about 10 Å.

2. The organic light-emitting display device according to claim 1, wherein the N-type semiconductor compound is selected from the group consisting of ZnO, ZnGaO, AnInO, In2O3, ZnInGaO, ZnSnO, ZnSnO, and combinations thereof.

3. The organic light-emitting display device according to claim 1, wherein the cathode electrode is composed of a material selected from the group consisting of ITO, Ag, Al, and combinations thereof.

4. The organic light-emitting display device according to claim 1, wherein the thin metal film is composed of a material selected from the group consisting of Cs, Mg, Li, and combinations thereof.

5. The organic light-emitting display device according to claim 1, wherein the driving thin film transistor array is a structure selected from the group consisting of a top gate structure, a bottom gate structure, a coplanar structure, and an inverted staggered structure.

6. The organic light-emitting display device according to claim 1, further comprising at least one of a hole injection layer or a hole transporting layer between the anode electrode and the organic light-emitting layer.

7. The organic light-emitting display device according to claim 1, further comprising at least one of an electron injection layer or an electron transporting layer between the cathode electrode and the organic light-emitting layer.

8. The organic light-emitting display device according to claim 1, wherein the substrate is composed of a transparent material, the cathode electrode is composed of ITO, and thin metal film is composed of Cs.

9. The organic light-emitting display device according to claim 1, wherein the substrate is composed of a transparent material, and the cathode electrode is composed of ITO: Cs.

10. The organic light-emitting display device according to claim 9, wherein the switching thin film transistor is an N-type thin film transistor.

11. The organic light-emitting display device according to claim 1, further comprising a reflective layer integrated within the cathode electrode or on a side of the cathode electrode facing oppositely away from the organic light-emitting layer and composed of a material selected from the group consisting of Au, Ag, Ni, and combinations thereof.

12. The organic light-emitting display device according to claim 1, wherein a pixel circuit of the organic light-emitting display device comprises:
   an organic light-emitting diode comprising the cathode electrode, the organic light-emitting layer, and the anode electrode; and
   an N-type driving thin film transistor comprising the semiconductor layer, the source electrode, and the drain electrode,
   wherein the drain electrode of the N-type driving thin film transistor is connected to the cathode electrode of the organic light-emitting diode, and
   wherein a switching thin film transistor is connected to a gate electrode of the driving thin film transistor.

13. A pixel circuit of an organic light-emitting display device comprising:

an organic light-emitting diode comprising: a cathode electrode, an anode electrode, an organic light-emitting layer between the cathode electrode and the anode electrode, and a thin metal film composed of a material having a lower work function than the cathode electrode, the thin metal film being between the organic light-emitting layer and the cathode electrode, wherein the thin metal film formed directly on the cathode electrode; and a driving thin film transistor comprising a semiconductor layer composed of an N-type semiconductor compound, a source electrode connected to a first region of the semiconductor layer, and a drain electrode connected to a second region of the semiconductor layer, the drain electrode being directly connected to the cathode electrode, wherein the thin metal film has a thickness ranging from about 0.01 to about 10 Å.

14. The pixel circuit according to claim 13, further comprising a switching thin film transistor connected to a gate electrode of the driving thin film transistor.

15. The pixel circuit according to claim 14, wherein the switching thin film transistor is an N-type thin film transistor.

16. The pixel circuit according to claim 13, wherein the N-type semiconductor compound is selected from the group consisting of ZnO, ZnGaO, AnInO, In2O3, ZnInGaO, ZnSnO, ZnSnO, and combinations thereof.

17. The pixel circuit according to claim 13, wherein the cathode electrode is composed of a material selected from the group consisting of ITO, Ag, Al, and combinations thereof.

18. The pixel circuit according to claim 13, wherein the thin metal film is composed of a material selected from the group consisting of Cs, Mg, Li, and combinations thereof.

* * * * *

UNITED STATES PATENT AND TRADEMARK OFFICE
CERTIFICATE OF CORRECTION

| | |
|---|---|
| PATENT NO. | : 7,777,225 B2 |
| APPLICATION NO. | : 12/120693 |
| DATED | : August 17, 2010 |
| INVENTOR(S) | : Hun-jung Lee et al. |

It is certified that error appears in the above-identified patent and that said Letters Patent is hereby corrected as shown below:

In the Claims

Column 6, Claim 1, line 7 — Delete "a"
Insert -- an --

Column 7, Claim 13, line 8 — After "film"
Insert -- is --

Signed and Sealed this
Twenty-seventh Day of December, 2011

David J. Kappos
*Director of the United States Patent and Trademark Office*